United States Patent
Lauinger et al.

(10) Patent No.: US 6,422,798 B1
(45) Date of Patent: Jul. 23, 2002

(54) PROCESS AND ARRANGEMENT FOR CONTINUOUS TREATMENT OF OBJECTS

(75) Inventors: Thomas Lauinger, Niedernberg (DE); Armin Aberle, Botany (AU); Richard Auer, Herzogen-Aurach (DE); Guido Halbach, Hannover (DE); Manuel Kanne, Kalletal (DE); Hanno Paschke, Hannover (DE); Jens Moschner, Zeven (DE)

(73) Assignee: Angewandte Solarenergie-Ase GmbH, Alzenau (DE)

( * ) Notice: Subject to any disclaimer, the term of this patent is extended or adjusted under 35 U.S.C. 154(b) by 0 days.

(21) Appl. No.: 09/507,899

(22) Filed: Feb. 22, 2000

(30) Foreign Application Priority Data

Apr. 22, 1999 (DE) .......................... 199 07 601

(51) Int. Cl.$^7$ .......................... B65G 25/00; B66C 17/08
(52) U.S. Cl. .................. 414/217; 198/741; 198/747; 198/468.01; 414/191; 414/225
(58) Field of Search .............................. 198/619, 690.1, 198/805, 468.01, 736, 738, 741, 747; 414/217, 225, 154, 191, 749.3, 805, 939

(56) References Cited

U.S. PATENT DOCUMENTS

| | | |
|---|---|---|
| 3,973,665 A | 8/1976 | Giammanco |
| 4,947,784 A | 8/1990 | Nishi |
| 5,382,126 A | 1/1995 | Hartig et al. |
| 6,206,176 B1 * | 3/2001 | Blonigan et al. ....... 198/619 X |
| 6,213,704 B1 * | 4/2001 | White et al. ............ 414/217 X |
| 6,235,634 B1 * | 5/2001 | White et al. ................. 414/217 |

FOREIGN PATENT DOCUMENTS

| | | |
|---|---|---|
| DE | 19745646 | 8/1927 |
| GB | 2143910 | 2/1985 |
| JP | 10067429 | 3/1998 |

OTHER PUBLICATIONS

SIEMENS —Prospekt: Magazinersystem für Werkstücke und Paletten, Bsl —Jun. 4, 1984.

* cited by examiner

Primary Examiner—Christopher P. Ellis
Assistant Examiner—Gene O. Crawford
(74) Attorney, Agent, or Firm—Dennison, Schultz & Dougherty

(57) ABSTRACT

The invention relates to a process for continuous treatment of objects in a processing unit, where the objects are moved along a conveyor track passing through the processing unit by a first linear-action conveyor device performing a back-and-forward movement and where the objects are supplied to/removed from the conveyor track by a transfer device. To permit with measures of simple design a continuous treatment without parasitic depositions or high temperatures impairing the process sequence, it is proposed that the objects be arranged on supports which are lined up on the conveyor track by at least two first linear-action conveying devices performing a back-and-forward movement and are then conveyed continuously through the processing unit, where the lining up and subsequent continuous conveying of the supports is performed such that one of the first conveying devices lines up a support transferred to the conveyor track with those supports already on the conveyor track while the other first conveying device continuously conveys the previously lined-up supports.

23 Claims, 3 Drawing Sheets

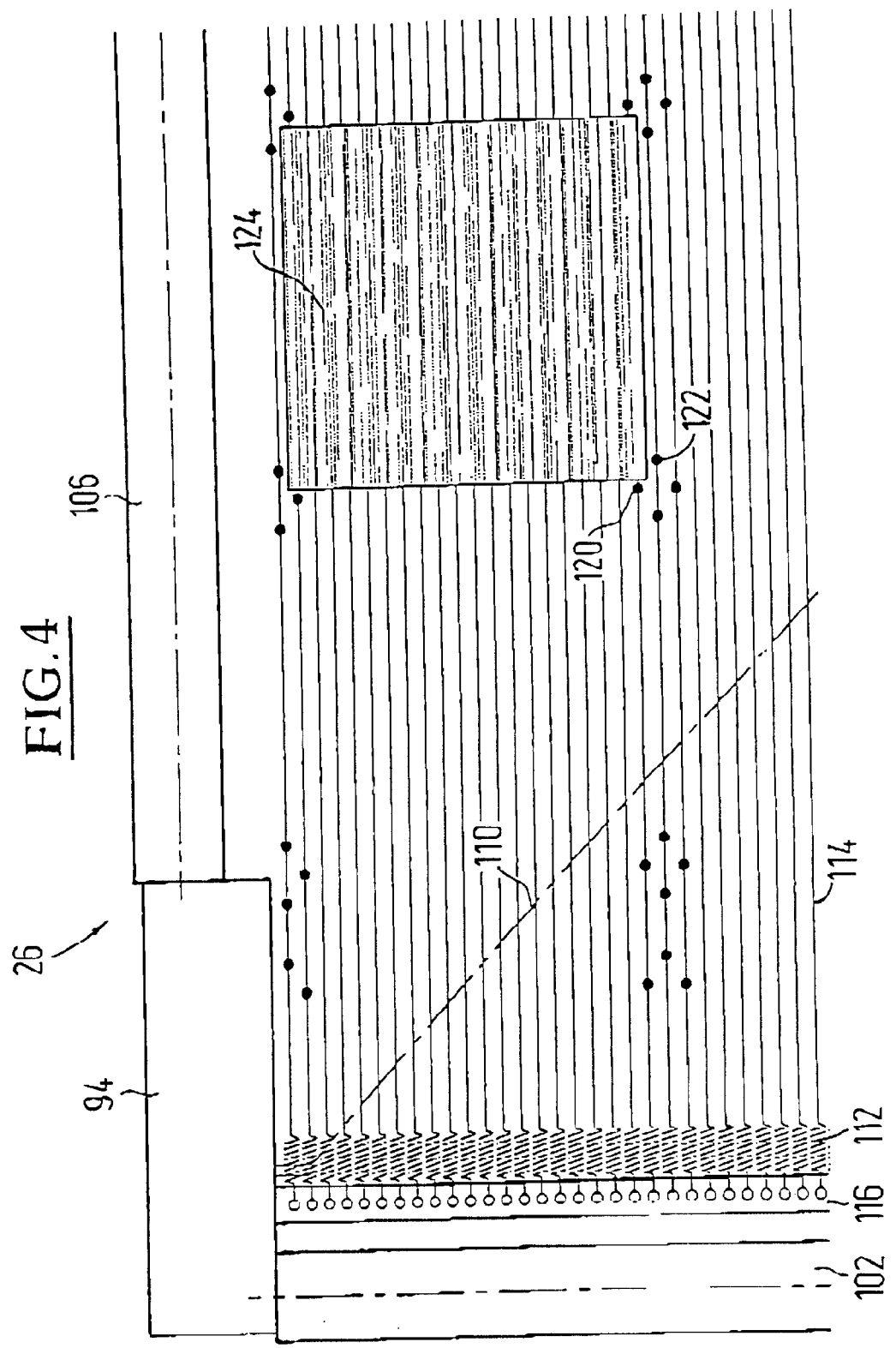

PROCESS AND ARRANGEMENT FOR CONTINUOUS TREATMENT OF OBJECTS

BACKGROUND OF THE INVENTION

The invention relates to a process for continuous treatment of objects in a processing unit, in particular for surface treatment of wafer-like objects such as semiconductor elements, preferably silicon wafers where the objects are moved along a conveyor track passing through the processing unit by a first linear-action conveyor device performing a back-and-forward movement and where the objects are supplied to/removed from the conveyor track by a transfer device. The invention further relates to an arrangement for continuous treatment such as surface treatment of objects arranged on supports, in particular wafer-like objects such as semiconductor elements, preferably silicon wafers, comprising a conveyor track passing through a processing unit and transfer devices for supplying/removing the supports to/from the conveyor track.

The surface treatment of objects is indispensable for the manufacture of a wide range of products in many fields of industry. The coating of objects with thin surface layers is particularly widespread, for preserving desirable product characteristics or ensuring them in the long term. Examples here are the coating of steel tools with thin abrasion-proof layers for reducing wear, or the coating of spectacle lenses with thin and optically active layers for reducing reflection. In the photovoltaics industry, solar cells are provided with thin surface coatings having a thickness of, for example, 80 nm, as a result of which their energy efficiency can be increased by up to 30% thanks to a number of physical effects.

Coating processes take place in some cases at atmospheric pressure, but frequently at low pressure. Low pressure is for example necessary to achieve sufficient homogeneity of the coating over the surface of the object. Also, it is frequently the case that certain deposition techniques are only possible at low pressure. A known coating process is low-pressure chemical vapor deposition. Here the surface coating grows from a reaction of one or more gases that are activated thermally or electrically in the form of plasma excitation.

The continuous coating on moving objects is used for improving the surface homogeneity of the coating. It is sufficient here for the coating device to be deposited homogeneously in one dimension, in particular in the direction transverse to the transport direction of the objects, By contrast, a two-dimensionally homogeneous deposition is required for coating on stationary objects, i.e. over the entire surface of the object. This leads to high extra expenditure from the technological viewpoint.

The steady movement of the objects relative to the coating source, necessary for a continuous coating, is achieved by a transport mechanism. The latter moves either the objects to be coated directly, or workpiece supports that receive those objects.

Workpiece supports for receiving the objects to be coated are used if the objects are not two-dimensional and/or the objects are fragile and/or the objects are not permitted to come into contact with the materials of the transport mechanism and/or the workpiece supports must perform a sealing function between the atmosphere and the low-pressure area. The workpiece supports used are as a rule plates made of steel, glass, graphite or ceramics and having recesses for receiving the objects.

Roller, chain and pusher drives can be used as the transport mechanism. In the case of the roller drive the preferably wafer-like objects or the workpiece supports run on a system of rollers that are actively driven.

In a chain drive, the objects are moved on a transport chain by drivers. Lightweight objects/workpiece supports can run directly on the chain. Above a certain weight, additional passively rotating rollers are used to take up the load.

In a pusher drive, the objects or workpiece supports are pushed through the treatment facility in a gap-free and endless line. Only the rearmost object/workpiece support is pushed in each case, and its movement is transmitted to all those in front of it. The pusher drive means that a continuous movement is not possible, since during the rearward movement of the pusher element the complete line of objects/workpiece supports stops. However, pusher drives are impervious to parasitic deposition and high temperatures.

With roller or chain drives, the transition from a timed to a continuous movement is achieved by operating the various roller to chain segments at differing speeds. This permits the use of these systems in low-pressure facilities which can insert and remove the objects/workpiece supports only in timed fashion via airlocks.

The roller or chain drive systems suitable for continuous transport present problems due to parasitic deposition and applications at high temperatures. Parasitic deposition occurs for example with plasma-supported low-pressure chemical vapor deposition. Only a disproportionately high expenditure can here prevent the roller bearings and/or chain links from also being coated and hence becoming hard to move in a very short time. If high temperatures are applied during processing of the objects, actively driven rollers or chains must be adequately protected from overheating. This too entails expensive measures.

The currently available workpiece supports present problems in facilities operating at high temperatures and high throughputs. To attain high resistance to warping at high temperatures, the workpiece supports must be of solid design. This gives them a high thermal capacity that leads to high energy losses when the supports are heated up and then have to be cooled down again outside the coating zone in quick succession. To achieve high throughputs in low-pressure facilities, the airlock chambers in which the supports are located must be evacuated as quickly as possible. This is critical if the airlock chambers have only one evacuation opening, for example due to technical reasons. In this case the air flowing out must flow around the support, thus slowing down the evacuation process. The provision of air flow apertures is only possible to a limited degree for stability reasons. In the case of wafer-like objects, the distance between the individual objects would also have to be increased. This is however undesirable for throughput rate reasons alone.

DE 43 03 462 C2 describes a multi-chamber coating facility in which substrates such as flat glass are treated. The substrates are here arranged spaced on supports and conveyed through the coating facility. To that end, slide elements such as rollers are provided that permit transportation at constant speed through the coating chambers.

U.S. Pat. No. 3,973,665 relates to a conveyor device for treatment of semiconductor substrates, for example by sputtering. To convey the objects, they are accommodated on supports that are conveyed at a distance from one another and in timed fashion. To that end, a conveying beam is provided for conveying the supports from one processing station to the next. It is furthermore necessary that the supports be gripped by further litters movable vertically to the movement of the lifting beam, so that the supports are disengaged from this beam when it moves back. Transport through airlocks is not possible.

GB 2 143 910 A relates to a system of supports that can be lined up to receive objects that are to be treated in a vacuum chamber. The supports themselves have geometrically adapted and interlocking edges that perform a sealing function during insertion into the vacuum chamber. Since the seals of the supports are not sufficiently high-temperature-proof, this system is unsuitable for high temperatures.

A conveying device is known from JP 10067429 A for substrates arrangable on a support that in turn is movable along rails by a spindle. A spindle drive for transporting wafers to be treated is also described in U.S. Pat. No. 4,947,784. The slides receiving the supports are passed through by the spindle. A transport device is known from DE 197 45 646 A1 that comprises shuttle conveyors and support lifting mechanisms for passing semiconductors through testing stations.

SUMMARY OF THE INVENTION

The problem underlying the present invention is to develop a process and an arrangement of the type mentioned at the outset such that continuous treatment like coating of two-dimensional objects in particular is possible with measures of simple design, with neither parasitic depositions nor high temperatures impairing the process sequence.

The problem is solved by the process substantially in that the objects are arranged on supports which are lined up on the conveyor track by at least two first linear-action conveying devices performing a back-and-forward movement and are then conveyed continuously through the processing unit, where the lining up and subsequent continuous conveying of the supports is performed such that one of the first conveying devices lines up a support transferred to the conveyor track with those supports already on the conveyor track while the other first conveying device continuously conveys the previously lined-up supports. The objects or supports themselves are conveyed through the processing unit at constant or almost constant speed.

In an embodiment of the invention, an object or a support carrying an object that exits the treatment or processing device is separated from the remaining lined-up objects by a second conveying device and aligned with a transfer device taking the objects or supports away from the conveyor track.

Pairs of pusher rods are preferably used as the first linear-action conveying device, and a pair of puller rods as the second conveying device.

An arrangement of the type mentioned at the outset is characterized in particular in that at least two first linear-action conveying devices performing a back-and-forward movement are assigned to the conveyor track for transporting the supports receiving the objects in front of the processing unit, and alternatingly line up individual supports in timed fashion with the supports lined up on the conveyor track and convey the lined-up supports continuously through the processing unit, and in that at least a second conveying device is assigned to the conveyor track for conveying of supports with treated objects, and separates the lined-up supports for alignment with the transfer device for removal of the support from the conveyor track.

Each support has a frame mounted on the guide rails determining the conveyor track.

In particular, the invention provides that consecutive supports on the conveyor track have differing receptacles for the first conveying devices, the latter being aligned with the supports in such a way that the support gripped by one of the first conveying devices remains ungripped by the other first conveying device and vice versa.

The first conveyor devices are here preferably designed as pusher elements such as plungers or rods preferably engaging by their front free ends in matched receptacles of the supports.

To that end it is provided in particular that viewed in the transport direction a first support of consecutive supports has a recess such as a groove running parallel to the transport direction that can be passed through by a first conveyor device, said recess or groove being aligned with a receptacle of the preceding support in the transport direction.

A further embodiment of the invention provides that the second conveyor device is designed in the form of puller elements such as plungers or rods. Here the second conveyor device can grip the supports using for example solenoids or mechanical couplings such as catches.

The first and/or second conveyor device can comprise a slide movable in particular by a spindle drive. The first and/or second conveyor device can also have an element such as a rod or plunger adjustable in a negative pressure range and connected via a vacuum seal with a drive such as a cylinder or spindle.

In accordance with a proposal that is inventive per se of the invention, the support receiving an object has a frame with corner pieces and frame elements such as ceramic rods connecting the latter, where diagonally opposite corner pieces are connected by tensioning elements.

The frame elements themselves are supported in sliding fashion on the rails forming the conveyor track.

Parallel tensioning elements such as wires tensioned by springs can extend from the frame itself as the support for at least one object. The clamping elements can here have fixing elements such as pressed-on metal balls for immobilizing the object.

The transfer device for placement/removal of the object onto/from the conveyor track can also be designed as a linear-action back-and-forward moving conveyor device in the form of, for example, a pusher rod or puller rod.

In detail, the arrangement comprises in particular three pairs of pusher rods, two pairs of puller rods and workpiece supports, where a transition from timed infeed of the workpiece supports to a continuous movement and in turn from the latter to a timed discharge is permitted by the pusher rods and puller rods. In this case, the workpiece supports can be pulled laterally onto a transport section by a pair of puller rods, and two parallel-operating pairs of pusher rods ensure a continuous movement of a gap-free row of at least two workpiece supports on the conveyor track, which in turn passes through by a processing unit that is traversed by the workpiece supports at a constant or almost constant speed. The workpiece supports themselves are, after passage through the processing unit, pulled by a pair of puller rods onto an end position of the conveyor track, from which position the workpiece supports are pushed off the conveyor track at the side by a pair of pusher rods.

The workpiece supports comprise a slide frame, with two differently shaped slide frames being transported alternatingly.

The conveyor track comprises a system of guide rails together with the slide frame form a sliding system.

Inside the slide frame of the workpiece supports, wires running parallel to one another are tensioned by springs and serve as supports for wafer-like objects. Metal balls can be pressed onto the wires themselves to define the position of the plate-like objects in the wire plane and to prevent any positional change of the objects themselves With the teachings in accordance with the invention, a transport system of simple design is provided by means of which a gap-free row of workpiece supports can be conveyed through a processing unit at constant speed onto a conveyor track designed as a guide rail system. A corresponding transport system is uncritical in respect of high temperatures and parasitic deposition, since in the coating area itself that are no moving parts of the transport mechanism. By the interaction of two linear-action conveyor devices in the form of pusher rods performing a back-and-forward movement, in conjunction with two differently designed workpiece supports, a timed workpiece support movement, necessary for example for passage through a vacuum airlock system is transformed into a continuous movement at constant infeed speed for treatment of the objects.

Furthermore, workpiece supports are provided by the teachings in accordance with the invention that have a minimal thermal capacity and a maximum conduction value for a gas flow passing vertically through the support. The wires tensioned inside the slide frame have because of their low diameter a minimal mass, so that the energy loss due to heat discharge via the workpiece support mass is minimized. The tensioning of the wires using springs means that the wire section is completely warp-free even at high temperatures. Gas can flow besides the positioned objects and through the interstice between the wires. The conduction value for this gas flow is determined almost exclusively by the spacing of the positioned objects and is hence maximal for every predetermined spacing. This makes the workpiece support ideal for use in airlock chambers pumped on one side with high throughput requirements. A displacement of two-dimensional workpieces is prevented by simple means, e.g. by metal balls pressed onto the wires.

Further details, advantages and features of the invention are shown not only in the claims and in the features they contain—singly and/or in combination—but also in the following description of preferred embodiments shown in the drawing.

BRIEF DESCRIPTION OF THE DRAWINGS

In the drawing,

FIG. 4 shows a section of the workpiece support according to FIG. 3.

DESCRIPTION OF THE PREFERRED EMBODIMENTS

Figure 1:
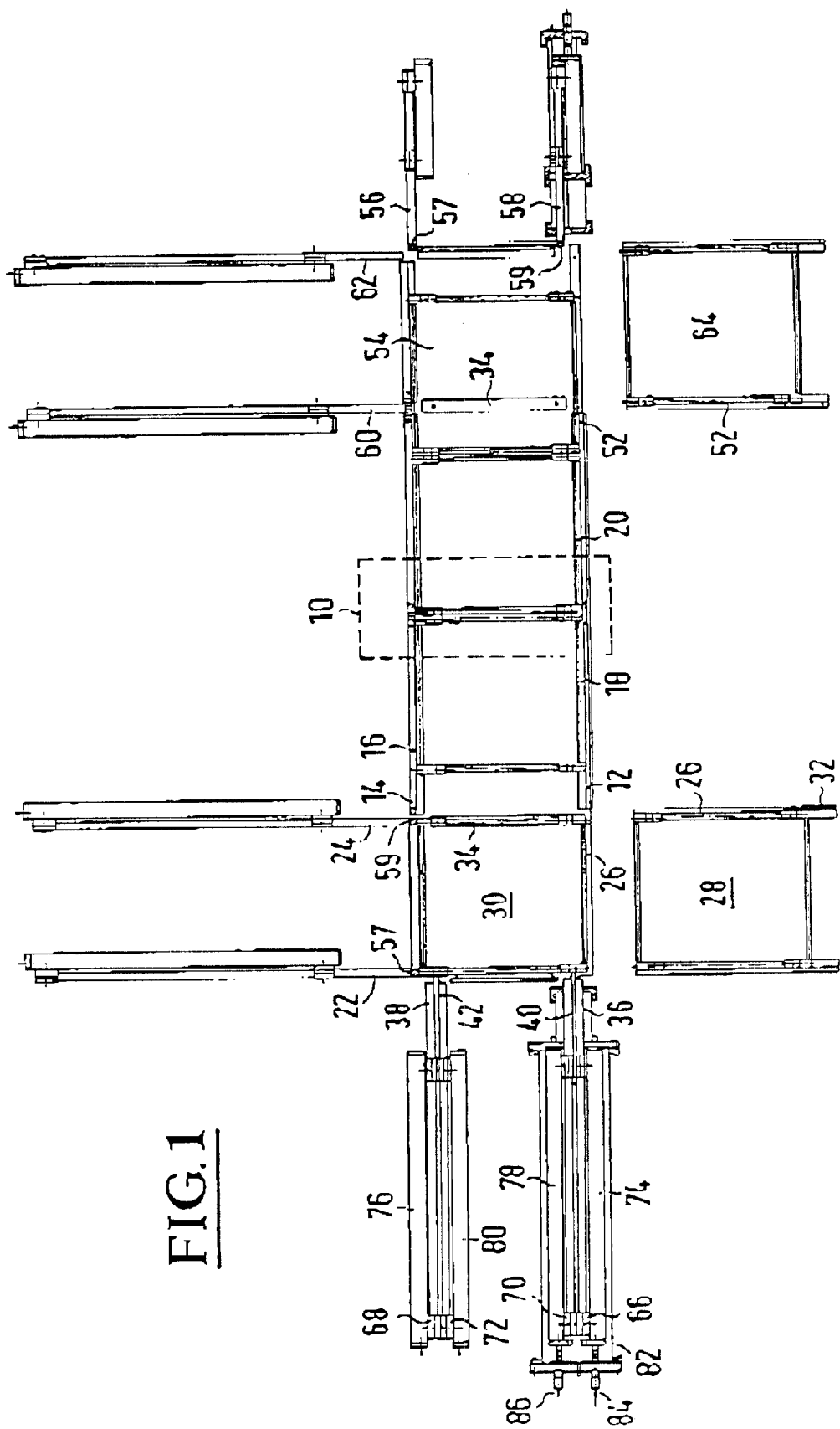
FIG. 1 shows a principle view of an arrangement for treatment of two-dimensional objects.

FIG. 1 shows purely in principle an arrangement for transporting two-dimensional objects such as in particular silicon wafers that are to be treated, e.g. coated, in a processing unit 10, for example in the form of a coating zone by means of low-pressure chemical vapor deposition. The arrangement 10 comprises a conveyor track 16 formed by transport rails 12, 14 that passes through the processing or treatment unit 10 and is conveyable along the workpiece supports 18, 20, where continuous transportation takes place within the treatment unit 10 itself. At least one and preferably several two-dimensional objects such as silicon wafers are fixed on the workpiece supports 18, 20 for treatment, i.e. coating, in the treatment unit 10 such as a coating zone.

The arrangement furthermore comprises a transfer device in the form of puller rods 22, 24, using which a workpiece support 26 is transported from a transfer position 28 onto the conveyor track 16 in order to take up a position 30 on the latter. To that end, the workpiece support 26 is moved on guide rails 32, 34, as a result of which correct alignment with the conveyor track 16 and hence with the transport rails 12, 14 is assured. The rails 12, 14, 32, 34 here guide the workpiece supports 18, 20, 26 both laterally and along their lower and upper sides to the required extent.

As soon as the workpiece support 26 is in the starting position 30, it is gripped by the first of two linear-action conveyor devices performing a back-and-forward movement in the form of a pair of pusher rods 36, 38 or 40, 42 such that the workpiece support 26 is lined up along the conveyor track 16 with workpiece supports 18, 20 already on the track. The pusher rods 36, 38 or 40, 42 therefore permit a rapid infeed movement of short duration that then merges into a slow infeed movement of long duration at constant speed in order to convey the lined-up supports 26, 18, 20 through the treatment or processing unit 10. During the slow infeed movement of the pusher rod pairs 36, 38 or 40, 42, the rearmost support 26 in the transport direction pushes the supports 18, 20 in front of it on the conveyor track 16.

Before the pusher rod pair 36, 38 or 40, 42 lines up the support 26 in the starting position 30 with the workpiece supports 18, 20 already lined up, the other pusher rod pair 40, 42 or 36, 38 engaging the workpiece support that was previously the last one—in the embodiment workpiece support 18 moves the lined-up workpiece supports 18, 20 at constant speed. However, as soon as the workpiece support 26 contacts the workpiece support 18 and a further transport is performed by the pusher rod pair 36, 38 or 40, 42, the other pusher rod pair 40, 42 or 36, 38 is retracted in order to move a further workpiece support moved by the puller rods 22, 24 along the conveyor track 16 in the manner described above.

Figure 2:
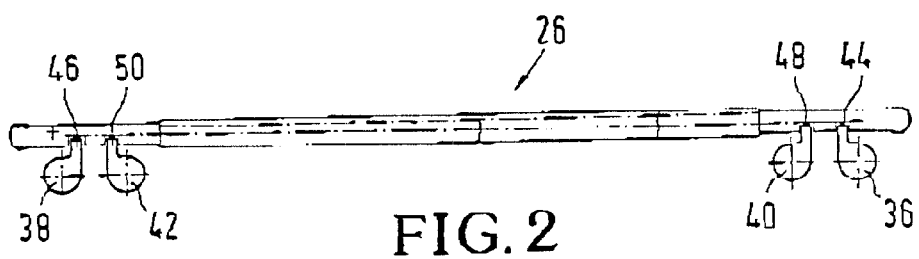
FIG. 2 shows a principle view of a workpiece support from the front.

As FIG. 2 is intended to make clear, the pusher rod pairs 36, 38 or 40, 42 are in a plane below that of the workpiece support 26, in order to ensure in the manner described below that workpiece supports movable along the conveyor track 16 cannot form a hindrance for the pusher rod pairs 36, 38 or 40, 42, thereby permitting workpiece supports to be moved into the starting position 30 and then along the conveyor track 16 to the required extent.

Figure 3:
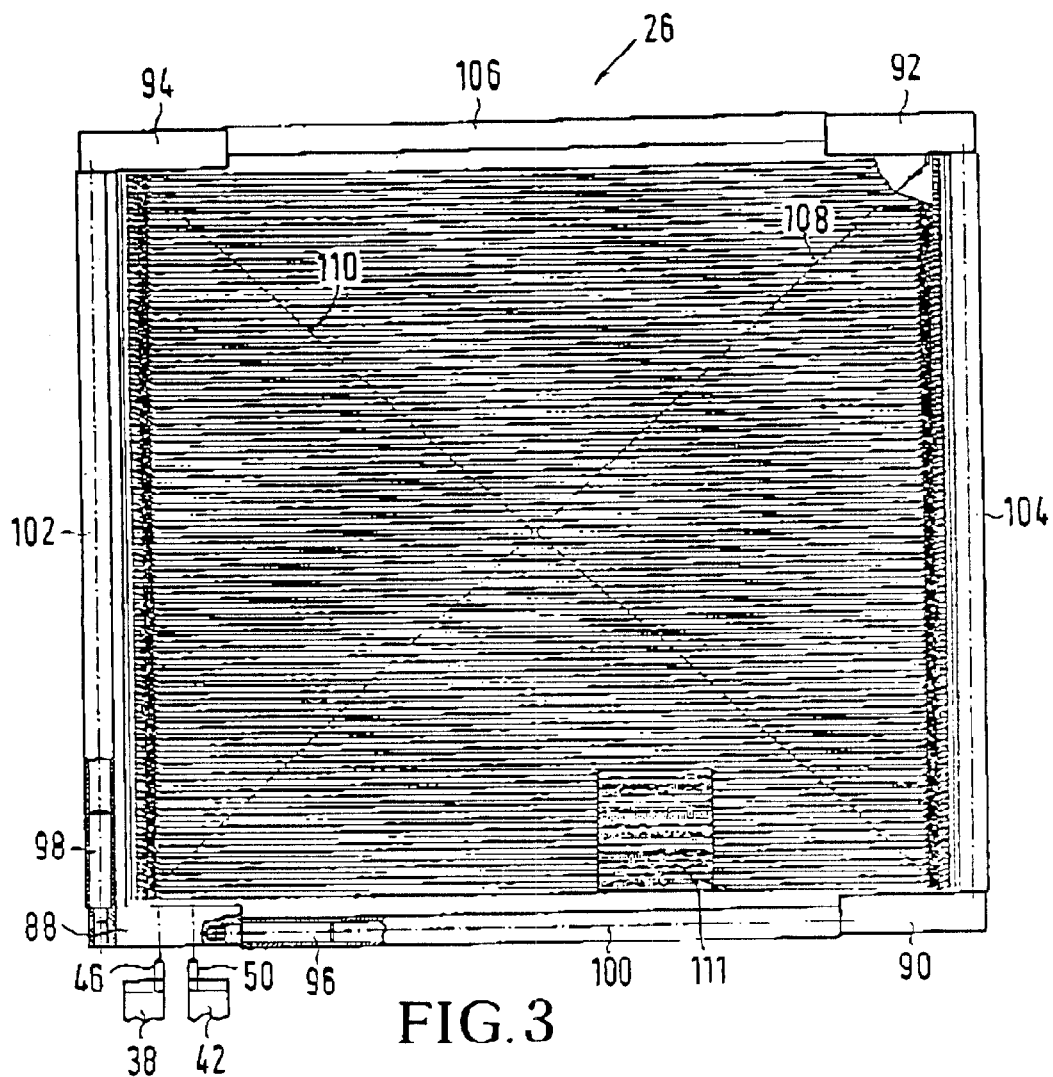
FIG. 3 shows a principle view of a workpiece support from above.

As FIGS. 2 and 3 show, drivers 44, 46 and 48, 50 designed as tips extend from the free ends of the pusher rod pairs 36, 38 and 40, 42 respectively and project as shown in FIG. 2 into the plane created by the workpiece supports, in order to transport or to pass through the workpiece support depending on the latter's design.

In accordance with the invention two different workpiece supports are used that are moved alternatingly along the conveyor track 16. For example, the workpiece support 26 has holes in which the drivers 44, 46 of the pusher rod pair 36, 38 can engage. This results in the possibility that during movement of the pusher rod pair 36, 38 in the direction of the treatment or processing unit 10 the workpiece support 26 is gripped and hence moved along the conveyor track 16. At the same time, the pusher rod pair 40, 42 can be moved underneath the workpiece support 26 without hindrance from it, in order to be retracted when the support 28 is aligned with support 18; because the pusher rod pair 40, 42 has during timed infeed of the support 26 by the pusher rod pair 36, 38 moved the lined-up supports 18, 20 at constant speed along the conveyor track 16. To that end, the support 26 has in the area of the movement paths of the drivers 48, 50 corresponding recesses such as grooves that relative to the preceding supports—in the embodiment the support 18 —merge into corresponding receptacles for the drivers 48, 50 of the pusher rods 40, 42.

By appropriate embodiment or design of the workpiece supports 26, 18, 20, a movement of the workpiece supports 18, 20, 26 along the conveyor track 16 in the manner described above is possible in such a way that every support is moved from the starting position 30 first at relatively high speed along the conveyor track 16 until it is lined up with the workpiece supports already on the conveyor track 16, in order to then be moved on at a constant speed together with the workpiece supports lined up in that way, with the pusher rod pair that generates the constant transport speed being able to pass unhindered through the last workpiece support in the transport direction. The speed during the constant movement is of course lower than that in the timed movement.

While in the embodiment pusher rod pairs 36, 38, 40, 42 are shown with drivers designed as tips 44, 46, 48, 50, other solutions fulfilling the same function are also possible, for example folding catches or rotatable drivers along the conveying direction, in order to engage with or disengage from the workpiece supports in the manner described above to the required extent.

As soon as a workpiece support 52 has passed completely through the treatment or processing unit 10, it is separated from the other lined-up workpiece supports 18, 20 by being pulled away, in order to be moved to a removal position 54 by means of puller rods 56, 58, by which the workpiece support 52 is transported out of the conveyor track 16 into a position 64 that can be designed as a vacuum airlock, so that the workpiece support 52 and hence the objects arranged thereon can be further processed to the required extent.

The puller rod pair 56, 58 can move in the plane created by the workpiece support 52 in order to grip the latter by means of, for example, magnetic or mechanical couplings 57, 59 such as catches. An identical connection method is conceivable for the puller rods 22, 24, by means of which the workpiece support 26 is likewise pulled from an airlock indicated by the position 28 into the starting position 30 on the conveyor track 16.

The puller rods 56, 58 can have at their respective front ends a solenoid matching a ferrite insert in the facing frame side of the support 52.

In the embodiment of FIG. 1, the pusher rods and puller rods 36, 38, 40, 42 are mounted on linear slides 66, 68, 70, 72 with spindle drives 74, 76, 78, 80. The spindles 74, 76, 78, 80 can be driven by electric motors, not shown in detail. The pusher rods 60, 22 and puller rods 22, 24, 56, 58 can be operated with the necessary linear-action back-and forward movement by linear slides not shown in detail.

If the movement of the workpiece supports 18, 20, 26, 52 is through a low-pressure system, the linear drive units must also operate at low pressure. The spindle drives 74, 76, 78, 80 are then encapsulated in tubular housings 82. The spindle drives 74, 76, 78, 80 are furthermore linked to vacuum-type rotary leadthroughs 84, 86, so that the drive motors can be operated on the atmosphere side.

Alternatively to spindles 74, 76, 78, 80 driven by electric motors, position-controlled pneumatic or hydraulic cylinders can be used to drive the pusher rods and puller rods 36, 38, 40, 42, 60, 62, or 22, 24, 56, 58.

The workpiece supports themselves, shown purely in principle as workpiece support 26 in FIGS. 2 and 3, comprise in accordance with the invention corner pieces 88, 90, 92, 94 designed in the embodiment as blocks and having the previously described receptacles or penetrations such as grooves to interact to the required extent with the drivers 44, 46, 48, 50 of the pusher rod pairs 36, 38, 40, 42. From each corner piece 88, 90, 92, 94, spikes 96, 98 extend that receive for example frame elements comprising ceramic rods 100, 102, 10, 106 that form together with the corner pieces 88, 90, 92, 94 a frame of the workpiece support 38. The frame itself is held together by braces 108, 110 connecting diagonally opposite corner pieces 88, 92 or 90, 94.

The diameters and designs of the ceramic tubes 100, 102, 104, 106 are such that they project at least on the outside, lower side and upper side beyond the corner pieces 88, 90, 92, 94, so that the frame elements 100, 102, 104, 106 can be supported in sliding fashion on the guide rails that form the transport and infeed/discharge tracks of the arrangement in accordance with FIG. 1. Other suitable materials can also be used apart from ceramics.

As the plan view of the workpiece support 26 in FIG. 3 makes clear, a large number of two dimensional objects 111 can be mounted thereon, which are then simultaneously treated, such as coated, in the treatment unit 10.

A part of the workpiece support 26 is shown in FIG. 4, with identical element being designated with identical numbers.

Wires 114 tensioned by springs 112 run between the frame elements 102, 104. The springs 112 here extend from inserted rods 116 connected in a manner not described in detail to the corner pieces 88, 94 or 90, 92. Fixing points such as metal balls 120, 122 are pressed onto the wires 114 with the required spacing, thus determining the position of a object 124. This ensures that two dimensional objects 111, 124 arranged on the support surface of the workpiece support 26 created by the wires 114 cannot slip and that the objects maintain a required distance from one another.

Instead of the use of two different workpiece supports passing alternatingly, it is also possible to work with only one workpiece support type. In this case the pusher rods must be provided with folding catches or rotatable drivers in order to prevent any collision between the released and retracting pusher rod with the rearmost workpiece support pushed forward by the second pusher rod pair.

What is claimed is:

1. A process for continuous treatment of generally planar objects in a processing unit in which the objects are moved in a direction along a conveyor track passing through the processing unit, comprising the steps of:

arranging the objects on supports and transferring the objects on the supports to the conveyor track with a transfer device;

lining up the objects on supports on the conveyor track with a first of at least two first linear-action conveying devices performing a back-and-forward movement; and conveying the objects on supports continuously through the processing unit with another of said at least two first linear-action conveying devices performing a back-and-forward movement;

wherein the at least two first linear-action conveying devices move in a direction generally parallel to the direction along the conveyor track.

2. Process according to claim 1, wherein the supports are conveyed through the processing unit at a substantially constant speed.

3. Process according to claim 1, wherein at least one pusher rod is used as the first linear-action conveying device performing a back-and-forward movement.

4. Process according to claim 1, wherein a plurality of objects arranged on supports are conveyed along the conveyor track.

5. Process according to claim 1, wherein an object that exits the processing unit is separated from the remaining lined-up supports by a second conveying device and aligned with a transfer device taking the support away from the conveyor track.

6. Process according to claim 5, wherein the second conveying device is a linear-action conveying device performing a back-and-forward movement.

7. Apparatus for continuous treatment of generally planar objects arranged on supports, comprising:

a conveyor track passing through a processing unit;

transfer devices for supplying the supports with objects thereon to and removing the supports with objects thereon from the conveyor track;

at least two first linear-action conveying devices performing a back-and-forward movement in a direction generally parallel to the conveyor track assigned to the conveyor track for receiving the objects in front of the processing unit and transporting the supports, means for operating the at least two first linear-action conveying devices to alternately line up individual supports in a timed fashion with supports lined up on the conveyor track, and convey a lined-up support continuously through the processing unit for treatment; and at least one second conveying device assigned to the conveyor track for conveying of supports with treated objects, and separate the lined-up supports for alignment onto a transfer device for removal of the support from the conveyor track.

8. Apparatus according to claim 7, wherein each first conveying device comprises a pair of pusher rods driven by a spindle drive or by pneumatically or hydraulically operated cylinders.

9. Apparatus according to claim 7, wherein the transfer device for placement of the support onto and/or for removal of the support from the conveyor track is a linear-action conveying device performing a back-and-forward movement in the form of pusher rods or puller rods.

10. Apparatus according to claim 7, wherein consecutive supports arranged on the conveyor track have differing receptacles for the first conveying devices.

11. Apparatus according to claim 7, wherein the first conveying devices are aligned with the supports or the supports are designed differently from one another in such a way that each said support gripped by one of the first conveying devices remains ungripped by the other first conveying device.

12. Apparatus according to claim 7, wherein the first conveying device comprises a driver provided at a front free end thereof for engaging a matched receptacle of a support.

13. Apparatus according to claim 7, wherein viewed in a transport direction, a first of a series of consecutive supports has a recess running parallel to the transport direction that can be passed through by the first conveying device, said recess being aligned with a receptacle of the preceding support in the transport direction.

14. Apparatus according to claim 7, wherein the second conveying device is connectable to a support via a magnetic or mechanical coupling means.

15. Apparatus according to claim 7, wherein the second conveying device comprises a solenoid that interacts with ferrite inserts provided on a side of the support.

16. Apparatus according to claim 7, wherein the supports are of identical design and the first conveying devices are sliding elements having folding catches or rotatable drivers for alternating gripping of consecutive workpiece supports.

17. Apparatus for according to claim 7, wherein the second conveying device assigned to the conveyor track for separating the previously lined-up supports is a second linear-action conveyor device performing a back-and-forward movement.

18. Apparatus according to claim 17, wherein the second conveying device comprises a pair of puller rods driven by a spindle or a pneumatically or hydraulically operated cylinder.

19. Apparatus according to claim 7, wherein the support comprises a frame mounted on the guide rails defining the conveyor track.

20. Apparatus according to claim 19, wherein the frame comprises corner pieces, frame elements connecting the corner pieces, and tensioning elements connecting diagonally opposite corner pieces.

21. Apparatus according to claim 20, wherein the frame elements are supported in sliding fashion on the rails forming the conveyor track.

22. Apparatus according to claim 19, wherein parallel clamping elements extend from the frame to hold up the objects.

23. Apparatus according to claim 22, wherein fixing elements for immobilizing the objects extend from the tensioning elements.

* * * * *